(12) United States Patent
Uchiyama (10) Patent No.: US 7,084,517 B2
(45) Date of Patent: Aug. 1, 2006

(54) SEMICONDUCTOR DEVICE CONNECTING STRUCTURE, LIQUID CRYSTAL DISPLAY UNIT BASED ON THE SAME CONNECTING STRUCTURE, AND ELECTRONIC APPARATUS USING THE SAME DISPLAY UNIT

(75) Inventor: Kenji Uchiyama, Suwa (JP)

(73) Assignee: Seiko Epson Corporation (JP)

( * ) Notice: Subject to any disclaimer, the term of this patent is extended or adjusted under 35 U.S.C. 154(b) by 32 days.

(21) Appl. No.: 10/955,798

(22) Filed: Sep. 30, 2004

(65) Prior Publication Data

US 2005/0056948 A1    Mar. 17, 2005

Related U.S. Application Data

(62) Division of application No. 09/068,270, filed as application No. PCT/JP97/03115 on Sep. 4, 1997, now Pat. No. 6,940,180.

(30) Foreign Application Priority Data

Sep. 5, 1996    (JP) .................................. 8-235615

(51) Int. Cl.
*H01L 29/73*    (2006.01)
*H01L 29/84*    (2006.01)
*H01L 23/495*   (2006.01)
*H01L 29/40*    (2006.01)

(52) U.S. Cl. ...................... 257/783; 257/178; 257/418; 257/669; 257/778

(58) Field of Classification Search ................ 257/777, 257/778; 438/118, 119
See application file for complete search history.

(56) References Cited

U.S. PATENT DOCUMENTS

| 4,356,642 | A |   | 11/1982 | Herman ........................ 36/44 |
| 4,604,644 | A | * | 8/1986  | Beckham et al. ............ 257/737 |
| 4,803,112 | A | * | 2/1989  | Kakimoto et al. ........... 428/161 |
| 5,072,289 | A | * | 12/1991 | Sugimoto et al. ............ 257/737 |
| 5,120,665 | A |   | 6/1992  | Tsukagoshi et al. .......... 156/64 |
| 5,187,123 | A |   | 2/1993  | Yoshida et al. |
| 5,225,966 | A | * | 7/1993  | Basavanhally et al. ...... 361/774 |
| 5,232,962 | A |   | 8/1993  | Dershem et al. |
| 5,262,225 | A | * | 11/1993 | Wilson et al. ............... 428/203 |
| 5,347,162 | A | * | 9/1994  | Pasch ......................... 257/773 |

(Continued)

FOREIGN PATENT DOCUMENTS

EP    0 265 077    4/1988

(Continued)

OTHER PUBLICATIONS

Gilleo, K., "Direct Chip Interconnect Using Polymer Bonding", IEEE Transactions on Components, Hybrids and Manufacturing Technology, vol. 13, No. 1, Mar. 1, 1990, pp. 229-234.

(Continued)

*Primary Examiner*—Carl Whitehead, Jr.
*Assistant Examiner*—James M. Mitchell
(74) *Attorney, Agent, or Firm*—Harness, Dickey & Pierce, P.L.C.

(57) ABSTRACT

A semiconductor device connecting structure is provided for connecting a semiconductor IC to a substrate. A bonding layer is placed between the substrate and the semiconductor IC to accomplish adhesion therebetween. Sufficient heat and pressure are applied to the bonding layer to create spaces therein which deform during relative movement between the semiconductor IC and substrate thereby maintaining consistent electrical contact between the semiconductor contact bumps and electrodes on the substrate.

16 Claims, 6 Drawing Sheets

U.S. PATENT DOCUMENTS

| | | | |
|---|---|---|---|
| 5,352,926 A | 10/1994 | Andrews | 257/717 |
| 5,401,564 A * | 3/1995 | Lee et al. | 442/210 |
| 5,401,587 A * | 3/1995 | Motohiro et al. | 428/688 |
| 5,422,175 A * | 6/1995 | Ito et al. | 428/304.4 |
| 5,444,301 A | 8/1995 | Song et al. | 257/737 |
| 5,445,308 A * | 8/1995 | Nelson et al. | 228/121 |
| 5,483,106 A | 1/1996 | Echigo et al. | 257/783 |
| 5,545,475 A * | 8/1996 | Korleski | 428/306.6 |
| 5,624,268 A * | 4/1997 | Maeda et al. | 439/66 |
| 5,631,191 A * | 5/1997 | Durand et al. | 438/119 |
| 5,670,251 A * | 9/1997 | Difrancesco | 428/325 |
| 5,818,700 A * | 10/1998 | Purinton | 361/760 |
| 5,846,853 A * | 12/1998 | Otsuki et al. | 438/119 |
| 5,847,796 A | 12/1998 | Uchiyama et al. | 349/151 |
| 5,888,609 A * | 3/1999 | Karttunen et al. | 428/107 |
| 5,893,623 A | 4/1999 | Maramatsu | 349/152 |
| 5,907,375 A | 5/1999 | Nishikawa et al. | 349/12 |
| 5,918,113 A * | 6/1999 | Higashi et al. | 438/119 |
| 5,973,389 A | 10/1999 | Culnane et al. | 257/678 |
| 6,059,917 A * | 5/2000 | Kyle | 156/292 |
| 6,246,098 B1 | 6/2001 | Paniccia | 257/437 |

FOREIGN PATENT DOCUMENTS

| | | | |
|---|---|---|---|
| EP | 0517071 | | 5/1992 |
| EP | 0 517 071 A1 | | 12/1992 |
| JP | 01-264230 | | 10/1989 |
| JP | 02-34951 | | 5/1990 |
| JP | 03-209840 | | 9/1990 |
| JP | 3284262 | | 12/1991 |
| JP | 04087213 | * | 3/1992 |
| JP | 02-133936 | | 5/1992 |
| JP | 04-132258 | | 6/1992 |
| JP | 04-174980 | | 6/1992 |
| JP | 04-292803 | | 10/1992 |
| JP | 05-267390 | | 10/1993 |
| JP | 06-013432 | | 1/1994 |
| JP | 06-232207 | | 8/1994 |
| JP | 06-242458 | | 9/1994 |
| JP | 08-203935 | | 8/1996 |
| JP | 09-196617 | * | 7/1997 |
| JP | 410022344 | * | 1/1998 |
| JP | 63-226036 | | 9/1998 |
| JP | 63-226038 | | 9/1998 |

OTHER PUBLICATIONS

Jin, Sungho et al, "Anisotropically Conductive Polymer Films with a Uniform Dispersion of Particles", IEEE Transactions on Components, Hybrids and Manufacturing Technology, vol. 16, No. 8, Dec. 1, 1993, pp. 972-977.

* cited by examiner

SEMICONDUCTOR DEVICE CONNECTING STRUCTURE, LIQUID CRYSTAL DISPLAY UNIT BASED ON THE SAME CONNECTING STRUCTURE, AND ELECTRONIC APPARATUS USING THE SAME DISPLAY UNIT

CROSS-REFERENCE TO RELATED APPLICATIONS

This application is a divisional patent application of U.S. Ser. No. 09/068,270 filed May 4, 1998 now U.S. Pat. No. 6,940,180 which is a 371 of PCT/JP97/03115 filed Sep. 4, 1997 claiming priority to Japanese Application No. 8-235615 filed Sep. 5, 1996, all of which are hereby incorporated by reference.

TECHNICAL FIELD

The present invention relates to a semiconductor device connecting structure for connecting a semiconductor device onto a substrate (or board), a liquid crystal display unit based upon the semiconductor device connecting structure, and an electronic apparatus using the liquid crystal display unit.

BACKGROUND OF THE INVENTION

In recent years, liquid crystal display units for displaying visible information have come into widespread use for electronic equipment such as navigation systems, televisions, palm-top computers, electronic organizers and portable telephones. In general, these liquid crystal display units are constructed such that a liquid crystal driving IC, i.e., a semiconductor device, is connected to a liquid crystal panel and incidental parts such as a back light and a casing are mounted on the liquid crystal panel. This liquid crystal panel is commonly made in a manner that a liquid crystal is put in between at least two substrates for the liquid crystal, and a polarizing plate, a color filter and others are mounted when necessary.

Many kind of ways of the connection of the liquid crystal driving IC to the liquid crystal panel have been considered, for example, connecting methods based upon a COB (Chip On Board) method, a COG (Chip On Glass) method or the like. According to the COB method, the liquid crystal driving IC is joined through the use of an ACF (Anisotropic Conductive Film) or other joining materials to an insulating substrate having a wiring pattern thereon, and that insulating substrate is connected through a heat seal or the like to the liquid crystal panel.

On the other hand, according to the COG method, the liquid crystal driving IC is directly joined through the use of the ACF or the like to a glass substrate having electrode terminals. In both the COB method and the COG method, a semiconductor device such as the liquid crystal driving IC is connected onto the substrate such as the insulating substrate and the liquid crystal glass substrate.

In the above-mentioned prior connecting methods, the ACF or other joining materials are uniformly placed in between the substrate and the liquid crystal driving IC without making a space therein. For this reason, when the liquid crystal driving IC is joined thereto under pressure, warps take place on the IC itself, or when the liquid crystal driving IC and/or the substrate deform due to the variation of temperature, excessive stresses occur at the bump portions of the liquid crystal driving IC in direct contact with the electrodes on the substrate. As a result, the electrical connecting conditions can become unstable. In addition, for avoiding such problems, the pressure-joining conditions for the liquid crystal driving IC are required to be severely managed within a small tolerance. As a result, a complicated process management is demanded.

Moreover, in the Japanese Unexamined Patent Publication No. 2-42738, there has been disclosed a connecting structure in which, in a COB based packaged printed-circuit board, a flexible bonding layer is placed as a cushioning material between an IC chip and a substrate to improve the reliability of the bond. However, in the case of this prior connecting structure, it is required to provide the flexible bonding layer for exclusive use for the purpose of taking the cushioning action, which leads to higher component cost and manufacturing cost.

Accordingly, the present invention has been developed with a view to eliminating the problems which arise with the prior semiconductor device connecting structure. The object of this invention is to maintain steadily the connecting condition of a semiconductor device to a substrate only by adding an extremely simple construction.

SUMMARY OF THE INVENTION

For the purpose described above, in accordance with the present invention, in a semiconductor device connecting structure for joining a semiconductor device onto a substrate according to this invention, there is a bonding layer in between the substrate and the semiconductor device for adhesion of both of them. The bonding layer contains a bonding material for joining the semiconductor device to the substrate and a space(s) formed in the interior of the bonding material.

According to this connecting structure, the space(s) is specially made in the bonding material when conducting the adhesion between the semiconductor device and the substrate, and absorb the deformation of the semiconductor device and others, changing freely in shape in response to the deformation of the substrate or the semiconductor device. In consequence, even in the case of the deformation of the semiconductor device or the substrate, it is possible to prevent excessive loads from applying on the electrode portions of the semiconductor device, so that the electrical connecting condition of the semiconductor device can be maintained steadily in good condition.

The space(s) is formed in the bonding material by pressurizing an IC with a pressurizing head and by heating at the same time as described below. When the temperature of the pressurizing head is given to the bonding material, the viscosity of the bonding material rapidly decreases to flow out to the external. In this way the space(s)can be formed. Thus, by forming the space(s) in the bonding material, it is possible to relieve the deformation of the semiconductor device or the substrate.

In the structure described above, as the semiconductor device, an IC chip and an LSI chip can be considered.

Further, when supposing a liquid crystal display unit, as the semiconductor device, a liquid crystal driving IC can be considered. As the substrate, an insulating substrate in the COB method, a transparent substrate for a liquid crystal in the COG method, and various substrates corresponding to other connecting methods can be considered. As the bonding material, an ACF (Anisotropic Conductive Film) and a common bonding material can be considered.

The ACF is produced by dispersing conductive particles into a thermoplastic film or a thermosetting resin film, and is a bonding material showing the conductivity in a single direction by receiving the thermocompression bonding.

On the other hand, the common bonding materials have a function to join a semiconductor device to a substrate only mechanically, not electrically.

In the case of using the ACF, the terminals on the substrate and the bumps of the semiconductor device are electrically coupled through the conductive particles to each other. On the contrary, in the case of using the common bonding material, the terminals on the substrate and the bumps of the semiconductor device are directly connected to establish an electrical conduction, and in this state, the semiconductor device is mechanically joined to the substrate by the common bonding material.

Figure 2:
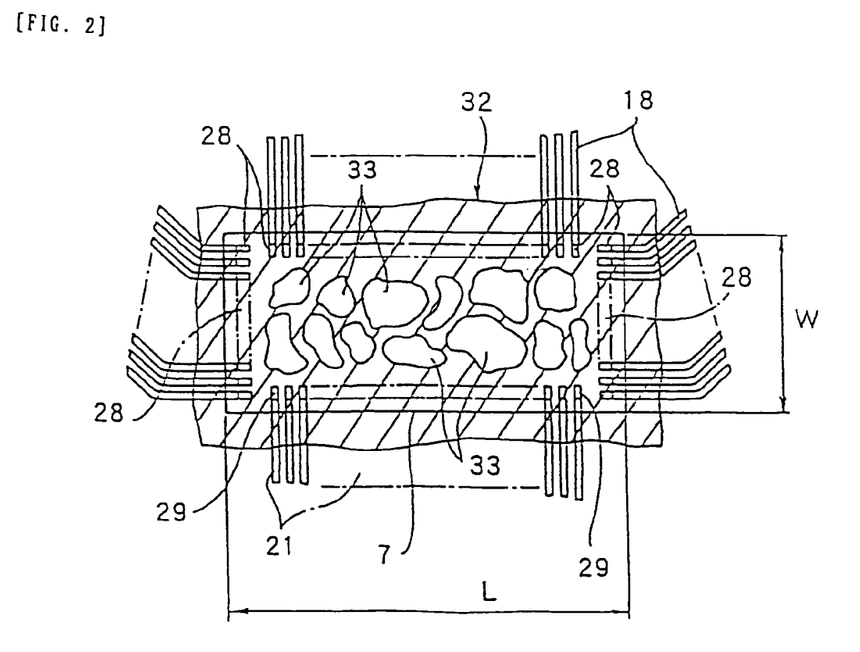
FIG. 2 is a plan view showing a joining portion of a semiconductor device at an arrow A in FIG. 1.
Figure 7:
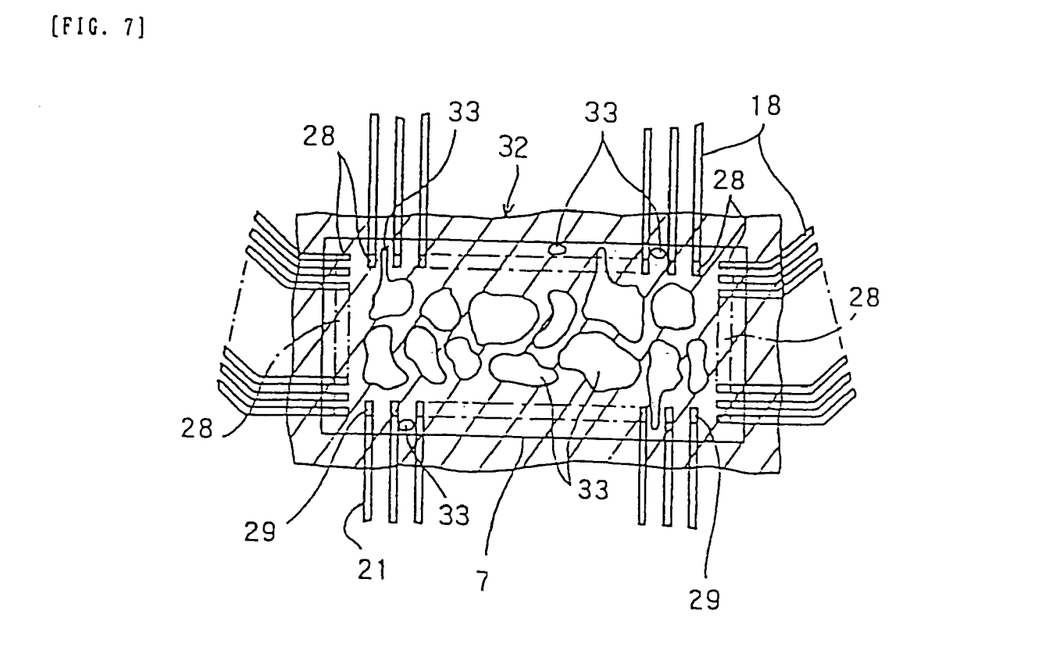
FIG. 7 is a plan view showing a modification of a way of forming spaces on an adhesive.
Figure 8:
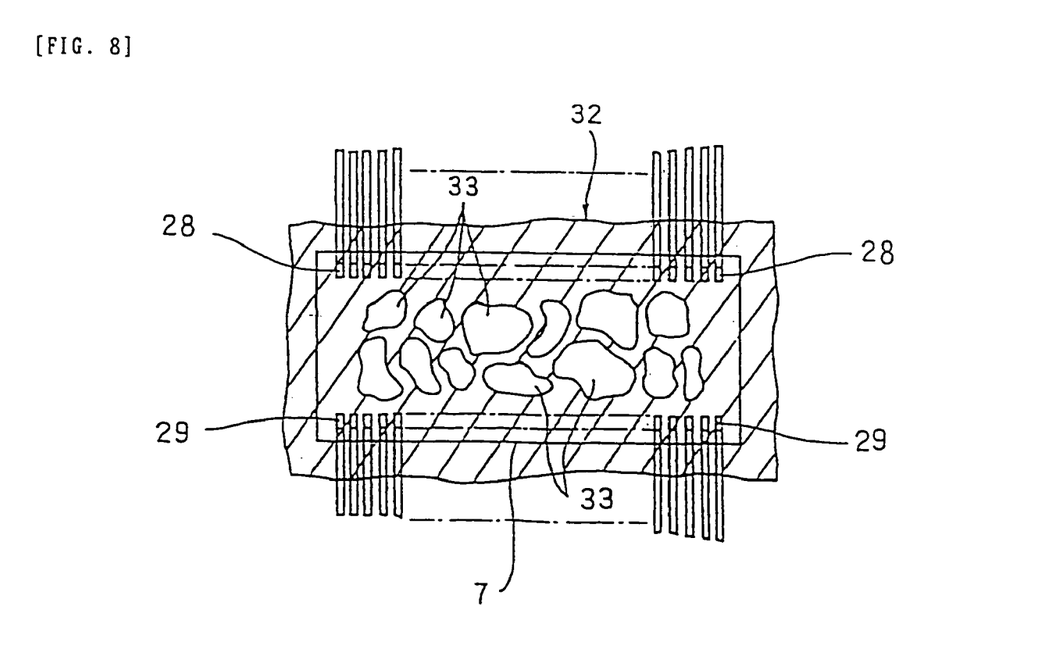
FIG. 8 is a plan view showing a modification of a bump arrangement on a semiconductor device.

Considering the liquid crystal driving IC to be used for a liquid crystal display unit as the semiconductor device, a plurality of bumps are arranged in rows on an active surface of the liquid crystal driving IC. Various ways can be considered for that in-row arrangement. For instance, as shown in FIGS. 2 and 7, a pair of bump strings 28, 29 arranged in rows (two rows in the illustrations) in the longitudinal direction and a pair of bump strings 28, 28 arranged in rows (two rows in the illustrations) in the transverse direction are arranged in a ring-shape. Further, as shown in FIG. 8, a pair of bump strings 28, 29 may be located only in the longitudinal direction or in the transverse direction.

For the connection of the semiconductor device with the foregoing bump arrangement onto the substrate, as shown in FIG. 2, spaces 33 are formed in an adhesive (bonding material) within an area surrounded by the ring-shaped arranged bumps, or as shown in FIG. 7, spaces 33 are formed between the respective bumps 28, 29 or outside the bump strings.

The spaces to be formed inside the adhesive can be made as a single space with a large volume, or can be made by disposing a plurality of spaces with small volumes in mutually close conditions.

Preferably, the space rate to the adhesive assumes between 5% and 70%, more preferably between 10% and 30%. This is because, in the case that the space rate is below 5%, it is impossible to absorb the deformation (or stress) of the semiconductor device or the substrate. On the contrary, when it assumes more than 70%, the reliability of the connection between the semiconductor device and the substrate (particularly, the terminals formed on the substrate) goes down. Accordingly, if the space(s) is formed at the rate of 5% to 70%, the connection reliability can be obtained. More preferably, if the space rate is set to between 10% and 30%, the structure with improved connection reliability can be formed.

The bonding layer is made of an epoxy-based adhesive. Further, this bonding layer absorbs the deformation of the semiconductor device or the substrate.

Furthermore, in accordance with the present invention, a feature of a connecting method of joining a semiconductor device onto a substrate is that a bonding layer is placed in between the substrate and the semiconductor device to join them to each other, and a pressurizing head heated up to a high temperature is pressed against the semiconductor device to pressurize and heat the mentioned bonding layer for joining the substrate to the semiconductor device, and a space(s) is formed in the mentioned bonding layer. With this construction, the deformation of the semiconductor device or the substrate can be reduced by the space(s), and a connecting structure with a higher reliability can be obtained. In addition, the bonding layer is made from an epoxy-based adhesive.

A liquid crystal display unit according to this invention is a liquid crystal display unit with the above-described semiconductor device connecting structure. In more detail, the liquid crystal display unit according to this invention is composed of a pair of substrates disposed in an opposed relation to each other to interpose a liquid crystal therein, a semiconductor device joined onto at least one of the substrates, and a liquid crystal display apparatus with a bonding layer placed in between the substrate and the semiconductor device to join the semiconductor device to the substrate wherein the bonding layer contains an adhesive for adhering the semiconductor device to the liquid crystal holding substrate and a space(s) made in the interior of the adhesive.

As mentioned above, it is preferable that the space rate to the adhesive is set to reach 5% to 70%, more preferably 10% to 30%, so that the semiconductor device and the electrode terminals formed on the substrate can be connected with a high reliability.

Moreover, concrete examples of an electronic apparatus using a liquid crystal display unit according to this invention are various kinds of equipment such as a navigation system, a television, a palm-top computer, an electronic organizer and a portable telephone. More specifically, one of the examples is the electronic apparatus with output terminals for driving a plurality of semiconductors, a liquid crystal display unit connected to these output terminals for driving a semiconductor, and an input unit. The liquid crystal display unit includes a pair of substrates disposed in an opposed relation to each other to interpose a liquid crystal therein, a semiconductor device joined onto at least one of the liquid crystal holding substrates, and a bonding layer placed in between the liquid crystal holding substrate and the semiconductor device to join the semiconductor device to the substrates for liquid crystal. In this case, the bonding layer contains an adhesive for adhering the semiconductor device to the substrates for liquid crystal and a space(s) made in the interior of the adhesive.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 6:
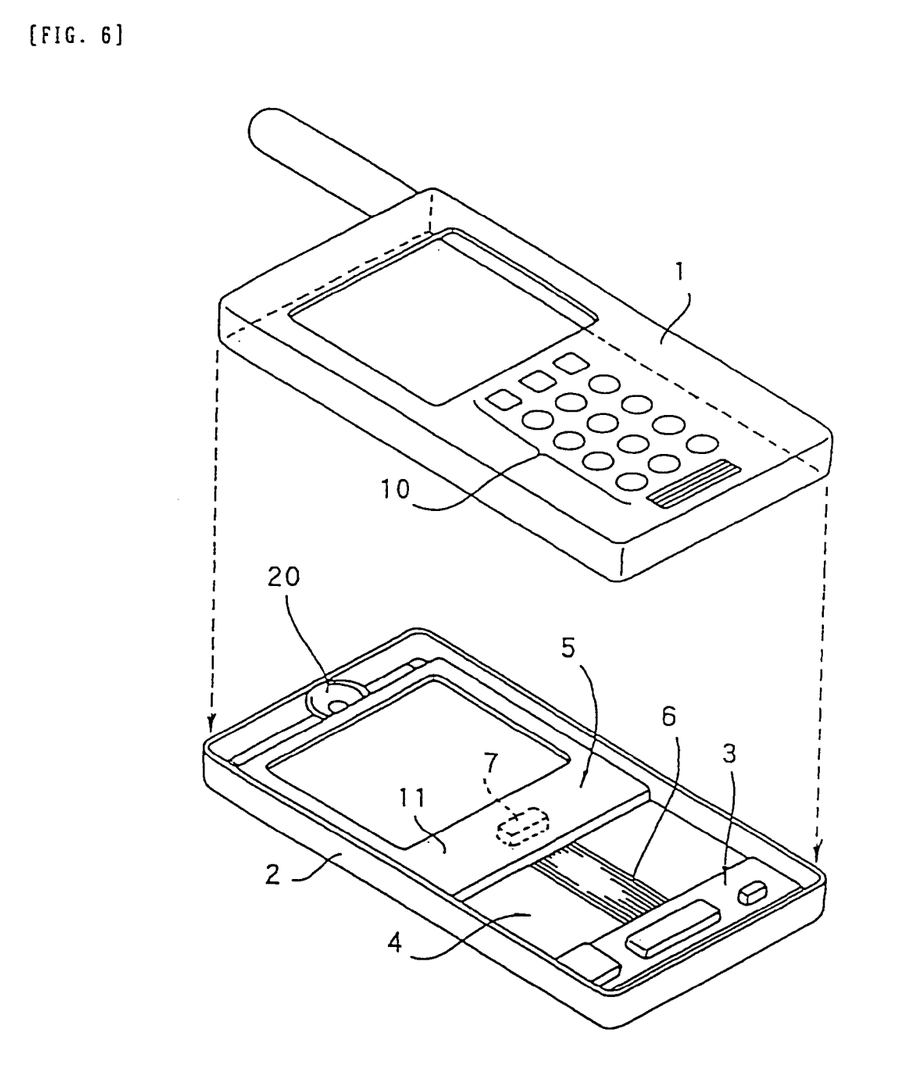
FIG. 6 is an exploded perspective view showing a portable telephone which is an embodiment of electronic apparatus according to an embodiment of this invention.

FIG. 6 shows a portable telephone as one example of electronic apparatus using a liquid crystal display unit according to an embodiment of the present invention. This portable telephone is equipped with an upper housing 1 and a lower housing 2. The upper housing 1 includes a PCB (Printed Circuit Board) for controlling a keyboard 10. In addition, the lower housing 2 includes a control circuit board 3 mounting a control LSI and a body board 4 mounting the circuit board 3. A liquid crystal display unit 5 according to this invention is mounted on the body board 4. A plurality of semiconductor driving output terminals 6 are formed as a wiring pattern on the surface of the body board 4. The liquid crystal display unit 5 has a liquid crystal driving IC 7, i.e., a semiconductor device, therein. The liquid crystal driving IC 7 is electrically connected to the semiconductor driving output terminals 6 with the liquid crystal display unit 5 mounted on the body board 4. The liquid crystal display unit 5 and other necessary units are placed within the lower housing 2 and subsequently upper housing 1 is placed thereon from the above. In this way a portable telephone is completed. Incidentally, numeral 20 designates a speaker.

Figure 3:
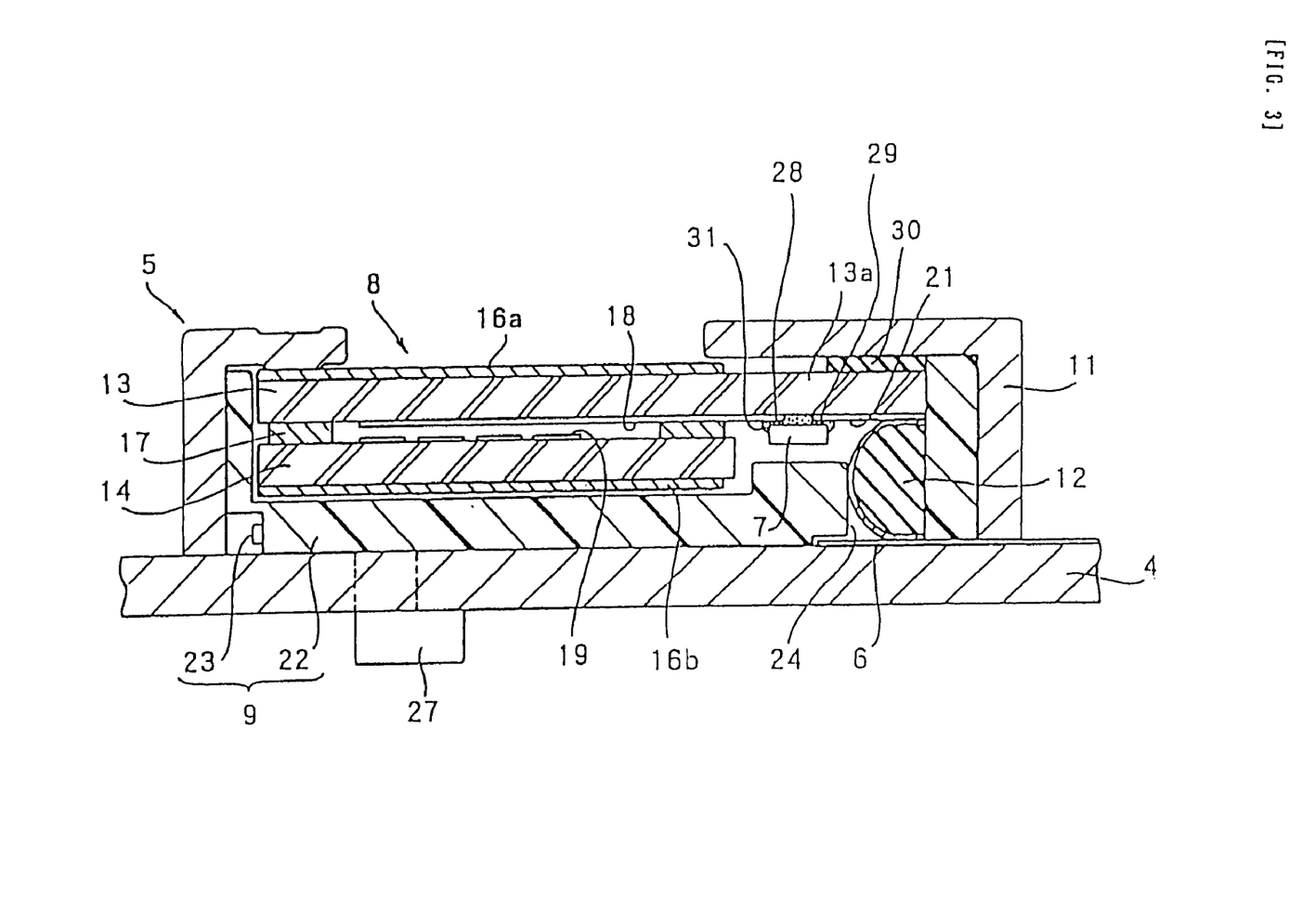
FIG. 3 is a side elevational cross-sectional view showing an embodiment of a liquid crystal display unit according to this invention.
Figure 4:
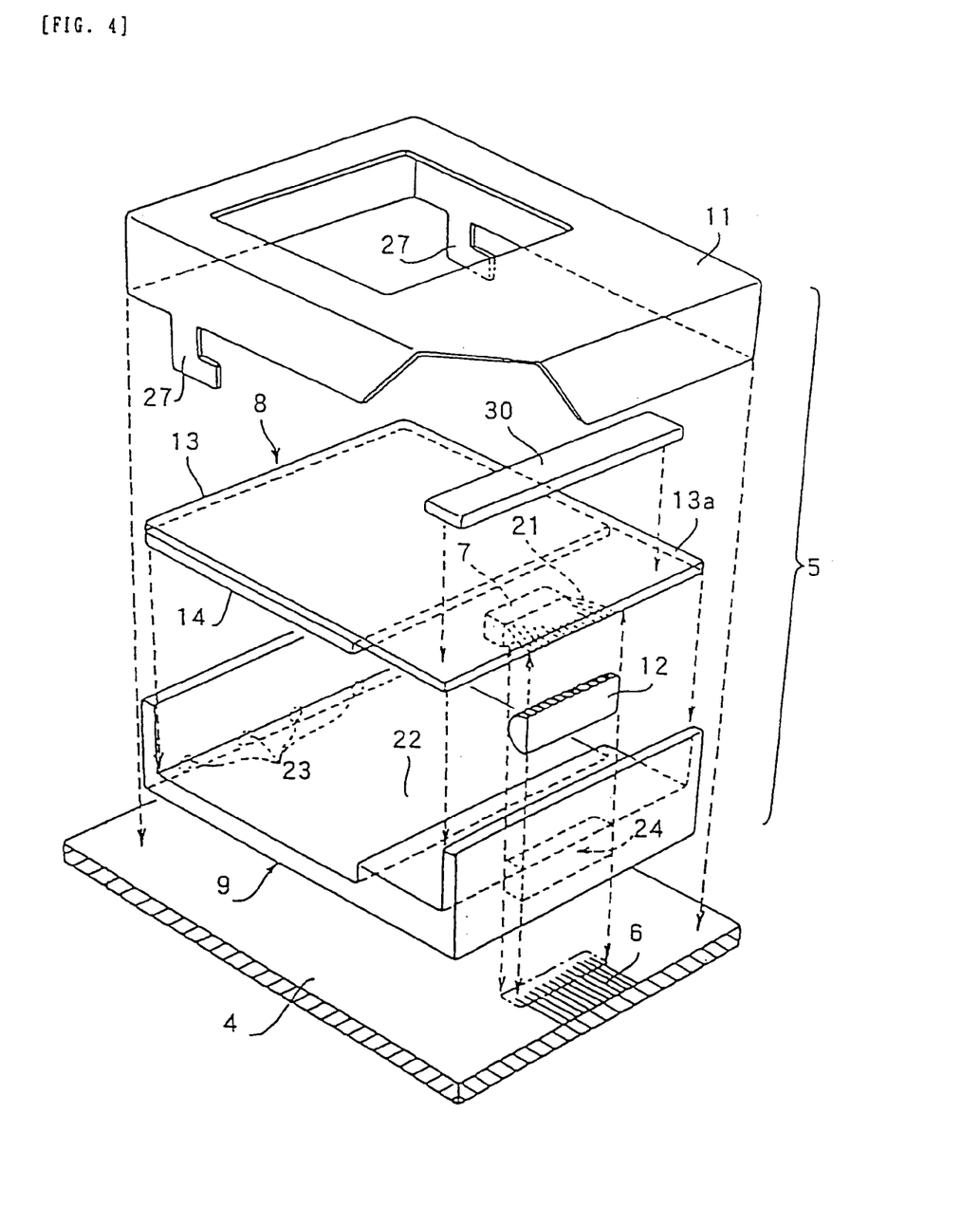
FIG. 4 is an exploded perspective view of a liquid crystal display unit shown in the FIG. 1.

For instance, as shown in FIG. 4, the liquid crystal display unit 5 includes a liquid crystal panel 8, a back light unit 9, a shielded case 11 and an elastic connector 12. The liquid crystal panel 8 includes, as shown in FIG. 3, a first liquid crystal holding substrate 13 made of a transparent glass and a second liquid crystal holding substrate 14 made of a transparent glass. A transparent electrode 18 is formed on an inner surface of the first liquid crystal holding substrate 13, whereas a transparent electrode 19 is formed on an inner surface of the second liquid crystal holding substrate 14. Both electrodes are made of an ITO (Indium Thin Oxide) and another transparent conductive material.

Furthermore, polarizing plates 16a, 16b, serving as polarizing means, are adhered to outer surfaces of the first and second liquid crystal holding substrates 13, 14, respectively. The first liquid crystal holding substrates 13 and second liquid crystal holding substrates 14 are joined in a liquid-proof condition to each other by a ring-like sealing compound 17 with a certain gap, so-called cell gap. Further, a liquid crystal is sealed in the cell gap. A semiconductor input terminal 21 is formed at a right-hand end portion on an inner surface of a section 13a of the first liquid crystal holding substrate 13 protruding toward the exterior (the right side in FIG. 3) of the second liquid crystal holding substrate 14. The liquid crystal driving IC 7 as a semiconductor device is directly adhered by a bonding layer 31 onto the first liquid crystal holding substrate 13, whereupon an output bump 28 of the IC 7 is connected to the transparent electrode 18 while an input bump 29 of the IC 7 is connected to the semiconductor input terminal 21.

Thus, this embodiment provides a liquid crystal display unit, that is, a COG (Chip On Glass) type liquid crystal display unit, where the liquid crystal driving IC 7 is directly joined to the liquid crystal holding substrate 13 constituting the liquid crystal panel 8.

In FIG. 3, the back light unit 9 comprises a light guiding member 22 and a plurality of (for example, 4) LEDs (Light Emitting Diodes) 23 fixed to a left-hand end portion of the light guiding member 22. Also, as shown in FIG. 4, a rectangular-parallelepiped-like guide hole 24 serving as a guide for the elastic connector 12 is made in a right-hand end portion of the light guiding member 22. As shown in FIG. 3, this guide hole 24 is made to have a dimension accepting the elastic connector 12 without making a gap.

Figure 5:
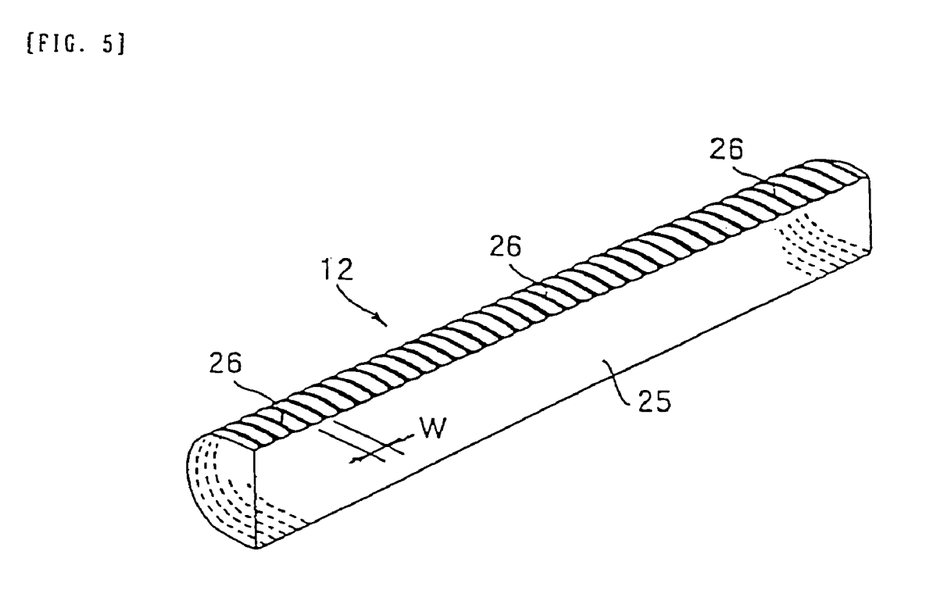
FIG. 5 is a perspective view showing one example of elastic connectors for electrically connecting a liquid crystal display unit to another circuit inside of an electronic apparatus.

The elastic connector 12 is, as shown in FIG. 5, equipped with an elastic material with an electrical insulation, for example, an elastic proximal section 25 made of a silicone rubber to have a cross-sectional semi-circular column-like configuration, and a large number of conductive sections 26 provided in parallel to each other on a semi-circular outer circumferential surface of the elastic proximal section 25. An elastic material is placed between the two conductive sections adjacent to each other to form a non-conductive section. The width of the non-conductive section is kept to be 15 μm to 25 μm. In the illustration, reference mark W represents the separation between the adjacent conductive section 26, so-called inter-conductive-section pitch, which is commonly set to W=30 μm to 50 μm.

For mounting the liquid crystal display unit according to this embodiment on the body board 4 of the portable telephone (FIG. 6), in FIG. 4, the elastic connector 12 is inserted into the guide hole 24 in the light guiding member 22, and the back light unit 9 is placed at a given position on the body board 4, and the liquid crystal panel 8 is placed at a given position on the back light unit 9, and the shielded case 11 is put on the liquid crystal panel 8 and the back light unit 9 in a state where a pressurizing member 30 made of a silicone rubber or another elastic material is interposed therein. And further, as shown in FIG. 3, the body board 4 and the shielded case 11 are tightened and fixed to each other by deforming a caulking stopper 27.

At this time, the elastic connector 12 is compressed and deformed elastically in the vertical direction due to the effect of the pressurizing member 30, whereupon the conductive sections 26 (see FIG. 5) firmly comes into contact with both the semiconductor input terminal 21 on the liquid crystal panel 8 side and the semiconductor driving output terminal 6 on the body board 4 side owing to the elastic restoring force of the elastic proximal section 25.

Incidentally, in terms of the way of compressing the elastic connector 12, it is also possible that, in place of preparing a dedicated component such as the pressurizing member 30, the corresponding portion of the shielded case 11 is deformed to protrude inwardly to form a rib at that portion of the shielded case 11 so that the rib compresses the elastic connector 12.

On the completion of the above-mentioned liquid crystal display unit attachment, an electric signal and a liquid crystal driving power are supplied from the control circuit board 3 (FIG. 6), through the semiconductor driving output terminal 6, the elastic connector 12 (FIG. 3) and the semiconductor input terminal 21, to the liquid crystal driving IC 7. According to that, the liquid crystal driving IC 7 controls the applied voltages to the electrodes 18, 19. Due to this voltage control, a visible image appears on an effective display region of the liquid crystal panel 8.

In this embodiment, since only by disposing the elastic connector 12 between the semiconductor input terminal 21 on the liquid crystal panel 8 side and the semiconductor driving output terminal 6 on the portable telephone side, both of them can be electrically connected to each other, the assembling work becomes extremely easy. In addition, since the elastic connector 12 is put within the guide hole 24, when a force works on the elastic connector 12, the elastic connector 12 warps without deformation such as buckling. Therefore, the electrical connecting condition between the semiconductor input terminal 21 and the semiconductor driving output terminal 6 can always be maintained steadily.

Figure 1:
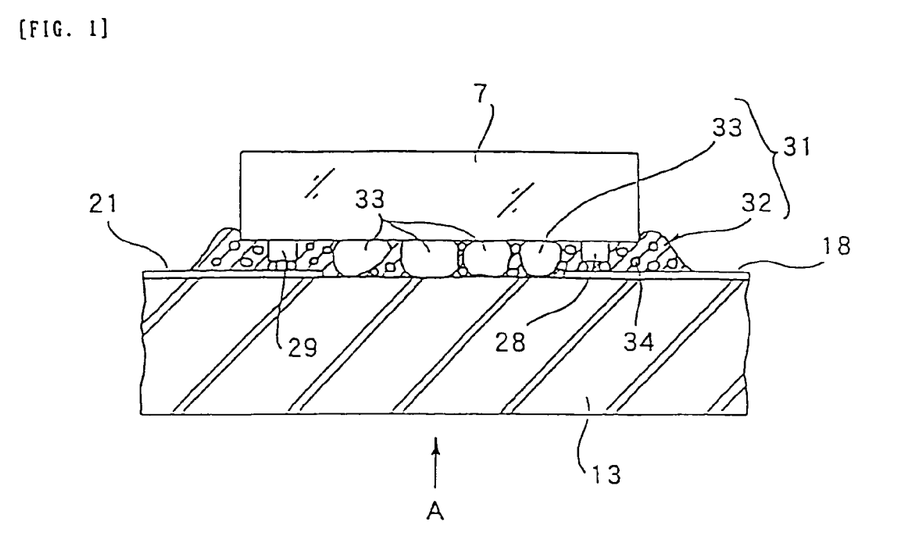
FIG. 1 is a cross-sectional view showing an embodiment of a semiconductor device connecting structure according to the present invention.

In this embodiment, as shown in FIG. 1, the liquid crystal driving IC 7 is adhered onto the first liquid crystal substrate 13 by the bonding layer 31. The bonding layer 31 is composed of an ACF (Anisotropic Conductive Film) 32 serving as an adhesive and a plurality of spaces 33 formed inside of the ACF 32. The ACF 32 is formed by dispersing a large number of conductive particles 34 into an adhesive-property resin film, and the output bump 28 of the IC 7 is electrically connected through the conductive particles 34 to the transparent electrode 18, whereas the input bump 29 is electrically connected through the conductive particles 34 to the semiconductor input terminal 21. Further, the bump 28, the bump 29 and the portions between the terminals are held in a insulated condition by an adhesive-property resin.

FIG. 2 shows the joining portion of the liquid crystal driving IC 7 viewed from the direction indicated by an arrow A in FIG. 1. Obviously from the illustration, the plurality of spaces 33 are positioned to be close to each other within an area surrounded by the bumps 28, 29 arranged in two rows in the longitudinal direction and the bumps 28, 28 arranged in two rows in the transverse direction, that is, within an area surrounded by the plurality of bumps 28, 29 arranged to make a ring-like configuration. Incidentally, although FIG. 2 is illustrated with the bumps 28 and 29 omitted, bumps are formed at the circumferential end portions of the substrates as well as where illustrated.

In general, for joining the liquid crystal driving IC 7 onto the substrate 13, the liquid crystal driving IC 7 is heated and pressed against the substrate 13 under a given pressure with the ACF 32 interposed between the IC 7 and the substrate 13. In this case, preferably, the ACF 32 is made of an epoxy-based adhesive. Particularly, if it is formed with a molecule including an epoxy radical at a relatively small molecular weight, an excellent adhesive property can be obtained.

At this heating and pressurizing processing, the liquid crystal driving IC 7 may warp, and when it warps, an excessive stress may occur in the connecting portions of the bumps 28 and 29, causing the electrically connecting condition to be unstable. Further, when the temperature varies in the liquid crystal driving IC 7, the IC 7 and/or the substrate 13 may deform, causing the connecting conditions of the bumps 28 and 29 to be unstable.

On the other hand, if the spaces 33 are provided inside the ACF 32 like this embodiment, when the liquid crystal driving IC 7 deforms, the spaces 33 freely can deform in accordance with the deformation of IC 7 and can absorb the deformation of the IC 7. As a result, the excessive stress on the connecting portions of the bumps 28, 29 can be prevented.

The way of forming the spaces 33 inside of the ACF 32 is not limited to a specific method. For example, if the pressure bonding condition for joining the liquid crystal driving IC 7 onto the substrate 13 is set to an appropriate condition for the liquid crystal driving IC to be used, the spaces 33 can be produced. The following requirements are listed as one example of the pressure-bonding condition.

(1) liquid crystal driving IC 7: SED1220 (manufactured by Seiko Epson Co., Ltd.)

In FIG. 2, this IC has a dimension of L×W=7.7 mm×2.8 mm, and the number of bumps is approximately 200 and the bump size is 80 μm×120 μm.

(2) ACF 32: CP8530 (manufactured by Sony Chemical Co., Ltd.)

(3) Heating temperature of ACF: 180 to 230° C. (central temperature=200 to 210° C.)

In the case that the ACF is pressurized and heated by pressing the IC 7 with the pressurizing head heated up to a high temperature, if the temperature of the pressurizing head is set to 260 to 360° C. (central temperature=approximately 300° C.), the aforesaid ACF temperature can be obtained.

(4) Pressurizing force of pressurizing head: 12 kgf to 20 kgf (5) Pressurizing time of pressurizing head: 10 seconds When the liquid crystal driving IC 7 was joined to the substrate 13 under the aforesaid (1) to (5) requirements, the plurality of spaces 33 shown in FIG. 2 were formed inside the ACF 32.

These spaces are formed in the ACF when, in the heating and pressurizing processing, the viscosity of the adhesive rapidly decreases at the initial-process heating (process for approximately 0.1 to 0.5 second) so that a portion of the bonding layer flows out toward the exterior of the semiconductor device. The space rate to the ACF is preferable to be in a range of 5% to 70%. This is because, in the case that the space rate is below 5%, the stress on the ACF can not be absorbed. On contrary, when the space rate exceeds 70%, the space rate is too high to connect the terminals (or the electrodes) to each other with a high reliability. Accordingly, the space rate is preferable to be set in this range. However, in order to connect with a particularly high reliability, it is preferable that the space rate is set in a range of 10% to 30%. When the space rate is set to be in this range, the internal stress can be reduced without losing the adhesion strength, connecting-with a high reliability.

FIG. 7 shows a modification of the method of making the spaces 33. The difference of this modification from the above-described embodiment shown in FIG. 2 is that, in addition to providing the spaces 33 between the bump strings 28, 29 in the longitudinal direction and between the bump strings 28, 28 in the transverse direction, the spaces 33 are formed between the respective bumps and outside the pair of bump strings. Even in the case of disposing the spaces 33 in this way, the connection of the semiconductor devices to the substrate can be maintained steadily. Incidentally, although FIG. 7 is illustrated with the bumps 28 and 29 omitted, bumps are formed around the end portions of the substrate as well as the illustrated bumps 28 and 29. Alternate long and short dash lines indicates the bumps. Likewise, FIG. 8 and 2 are illustrated with the bumps omitted, but the same bumps as the illustrated bumps 28, 29 are formed around the substrate end portions.

FIG. 8 shows a modification of the bump arrangement. The difference of this modification from the above-described embodiment shown in FIG. 2 is that, instead of arranging the plurality of bumps 28, 29 to make a ring-like configuration, the bumps are disposed in rows only in the longitudinal direction. In this modification, a plurality of spaces 33 are provided between the bump strings 28, 29. However, instead of or in addition to these spaces, the spaces 33 can also be provided between the respective bumps and/or outside the bump strings.

The present invention has been described with some preferred embodiments, but this invention is not limited to those embodiments, and includes various changes within the technical ranges described in the claims.

For instance, the semiconductor connecting structure and the liquid crystal display unit according to this invention are applicable to various electronic apparatus other than a portable telephone, such as a navigation system, a television, a palm-top computer and an electronic organizer, which require a visible information display.

FIGS. 3 to 5 indicate the embodiments which this invention is applied to the COG (Chip On Glass) type liquid crystal display unit. However, this invention is also applicable to the other types of liquid crystal display units, for example, a COB (Chip On Board) type liquid crystal display unit.

Furthermore, in the embodiments shown in FIGS. 3 to 5, the output terminal 6 on the portable telephone side as an electronic apparatus and the input terminal 21 on the liquid crystal panel 8 side are electrically connected to each other by the elastic connector 12. However, the connecting method for connecting both of them is not limited to this. For example, this invention includes a case of connecting both terminals by using an FPC (Flexible Printed Circuit).

Still further, in the embodiment shown in FIG. 1 the bonding layer 31 is constructed with the ACF 32 containing the conductive particles 34. Instead, it can be made by using an adhesive which does not contain conductive particles. In this case, spaces 33 are formed inside the adhesive. In addition, in this case, the bumps for the liquid crystal driving IC 7 are directly connected to the electrode terminals on the liquid crystal panel side.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A semiconductor device comprising:
   a substrate;
   a semiconductor device; and
   a bonding layer interposed between the substrate and the semiconductor device, the bonding layer including an anisotropic conductive bonding material and a plurality of spaces, said spaces being deformable during heating, the bonding material having a resin, the resin including a plurality of randomly dispersed conductive particles that each have a size substantially smaller than a size of each of the plurality of spaces, and the bonding material adhering the semiconductor device and the substrate to each other, the spaces being located within the bonding material at a percentage of spaces to bonding material of 5% to 70%, and the spaces being substantially free from solids and liquids.

2. The semiconductor device of claim 1, wherein said plurality of spaces are arranged in close proximity to each other.

3. A semiconductor device comprising:
   a substrate;
   a semiconductor device; and
   a bonding layer interposed between the substrate and the semiconductor device, the bonding layer including an anisotropic conductive bonding material and a plurality of spaces, said spaces being deformable during heating, the bonding material having a resin, the resin including a plurality of randomly dispersed conductive particles that each have a size substantially smaller than a size of each of the plurality of spaces, and the bonding material adhering the semiconductor device and the substrate to each other, the spaces being located within the bonding material and being substantially free from solids and liquids, and each of the plurality of spaces being continuous from the substrate to the semiconductor device.

4. The semiconductor device of claim 3, wherein said spaces change shape in response to relative movement of at least one of said substrate and said semiconductor device.

5. The semiconductor device of claim 3, wherein said bonding layer is made of an epoxy-based bonding material.

6. The semiconductor device of claim 3, wherein said plurality of spaces are arranged in close proximity to each other.

7. A semiconductor device comprising:
   a substrate;
   a plurality of electrodes formed on the substrate;
   a semiconductor device;
   a plurality of bumps interposed between the semiconductor device and the electrodes, the bumps having a height extending in a direction from the substrate to the semiconductor device; and
   a bonding layer interposed between the substrate and the semiconductor device, the bonding layer including an anisotropic conductive bonding material and a plurality of spaces, said spaces being deformable during heating, the bonding material having a resin, the resin including a plurality of randomly dispersed conductive particles that each have a size substantially smaller than a size of each of the plurality of spaces, and the bonding material adhering the semiconductor device and the substrate to each other, the spaces being located within the bonding material and being substantially free from solids and liquids, and each of the plurality of spaces having a height dimension greater than the height of the bumps.

8. The semiconductor device of claim 7 wherein the height of said bumps is less than the distance between said substrate and said semiconductor device.

9. The semiconductor device of claim 7, wherein said plurality of spaces are formed between said bumps, outside said bumps and between said bumps, or at least within one of the areas therein.

10. The semiconductor device of claim 7, wherein said bonding layer is made of an epoxy-based bonding material.

11. The semiconductor device of claim 7, wherein said plurality of spaces are arranged in close proximity to each other.

12. The semiconductor device of claim 7, wherein said spaces change shape in response to relative movement of at least one of said substrate and said semiconductor device.

13. A semiconductor device comprising:
a substrate;
a plurality of electrodes formed on the substrate;
a semiconductor device that has a plurality of bumps electrically connected to the electrodes; and
a bonding layer interposed between the substrate and the semiconductor device, the bonding layer including an anisotropic conductive bonding material and a plurality of spaces, said spaces being deformable during heating, the bonding material having a resin, the resin including a plurality of randomly dispersed conductive particles that each have a size substantially smaller than a size of each of the plurality of spaces, and the bonding material adhering the semiconductor device and the substrate to each other, the conductive particles electrically connecting the bumps and the electrodes and having a maximum dimension, the spaces being located within the bonding material and being substantially free from solids and liquids, and each of the plurality of spaces having a dimension greater than the maximum dimension of the conductive particles.

14. The semiconductor device of claim 13, wherein said bonding layer is made of an epoxy-based bonding material.

15. The semiconductor device of claim 13, wherein said plurality of spaces are arranged in close proximity to each other.

16. The semiconductor device of claim 13, wherein said spaces change shape in response to relative movement of at least one of said substrate and said semiconductor device.

* * * * *